(12) United States Patent
Golshan et al.

(10) Patent No.: US 6,674,646 B1
(45) Date of Patent: Jan. 6, 2004

(54) VOLTAGE REGULATION FOR SEMICONDUCTOR DIES AND RELATED STRUCTURE

(75) Inventors: Khosrow Golshan, Laguna Beach, CA (US); Siamak Fazelpour, San Diego, CA (US); Hassan S. Hashemi, Laguna Nigael, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 09/971,162

(22) Filed: Oct. 5, 2001

(51) Int. Cl.⁷ .............................. H05K 7/02; H05K 7/06; H05K 7/08; H05K 7/10
(52) U.S. Cl. .................. 361/760; 361/761; 361/764; 361/735; 361/790; 361/775; 361/792; 361/794; 361/783; 361/780; 257/738
(58) Field of Search ................................. 361/760, 761, 361/762, 763, 764, 736, 780, 783, 777, 794, 748, 735, 790, 775, 792; 323/349; 327/540; 257/738

(56) References Cited

U.S. PATENT DOCUMENTS

| | | | | |
|---|---|---|---|---|
| 3,836,697 A | * | 9/1974 | Schultz ..................... 174/68.5 |
| 5,744,944 A | * | 4/1998 | Danstrom ..................... 323/284 |
| 5,757,171 A | * | 5/1998 | Babcock ....................... 323/271 |
| 5,831,810 A | * | 11/1998 | Bird et al. ................ 361/301.1 |
| 5,938,769 A | * | 8/1999 | Hu .............................. 713/300 |
| 5,939,868 A | * | 8/1999 | Hall et al. ................... 323/281 |
| 6,116,863 A | * | 9/2000 | Ahn et al. ................... 417/322 |
| 6,230,276 B1 | * | 5/2001 | Hayden ...................... 713/320 |
| 6,363,450 B1 | * | 3/2002 | Lash et al. .................. 710/301 |
| 6,476,486 B1 | * | 11/2002 | Humphrey et al. ......... 257/738 |

* cited by examiner

*Primary Examiner*—David Martin
*Assistant Examiner*—Thanh Yen Tran
(74) *Attorney, Agent, or Firm*—Farjami & Farjami LLP

(57) ABSTRACT

An output of a voltage regulator is a core voltage line that runs adjacent to a die attach area on a packaging substrate. An input of the voltage regulator is typically coupled to a power supply which, in one embodiment, is also an I/O voltage line that runs adjacent to the die attach area. In one embodiment, the core voltage line is shaped as a ring encircling the die attach area on the packaging substrate. In another embodiment, the I/O voltage line is also shaped as a ring encircling the die attach area on the packaging substrate. Further, a semiconductor die having at least one I/O Vdd bond pad and at least one core Vdd bond pad can be mounted in the die attach area. The I/O Vdd bond pad and the core Vdd bond pad can be connected, respectively, to the I/O voltage ring and the core voltage ring.

23 Claims, 3 Drawing Sheets

VOLTAGE REGULATION FOR SEMICONDUCTOR DIES AND RELATED STRUCTURE

BACKGROUND OF THE INVENTION

1. Field of the Invention

The present invention is generally in the field of semiconductor fabrication and packaging. More particularly, the present invention is in the field of voltage regulation for semiconductor dies.

2. Related Art

One role of a voltage regulator is to generate a stable and desired output voltage from a source that may be fluctuating or is otherwise unsuitable for a target device or circuitry. As is known in the art, a typical voltage regulator has an input terminal supplied with a power supply, an output terminal for providing a desired output voltage to the target device or circuitry and a reference input which, through a feedback mechanism, monitors the output voltage of the voltage regulator and ensures that the output is appropriate for the target device or circuitry. As an example, a voltage regulator can convert a 3.3 volt external power supply into a 1.8 volt internal supply for use in a semiconductor chip's internal or core circuitry.

Structure 100 in FIG. 1 shows a conventional approach wherein a voltage regulator is situated inside the die to generate a steady and desired voltage for the die's core circuitry. As shown in FIG. 1, semiconductor die ("die") 120 is attached to substrate 116, which is mounted on printed circuit board ("PCB") 140. Die 120 has bond pads, e.g. bond pad 130, which serve as means by which die 120 can be electrically connected to PCB 140 or to other devices on PCB 140 by way of bond wires and leads (not shown) in a manner known in the art. Bond pads on die 120 can be, for example, I/O pads interfacing with external devices or Vdd pads supplying power to the core. Die 120 further comprises voltage regulator 110, which in the present example is a 3.3V-to-1.8V regulator, meaning that voltage regulator 110 converts a 3.3 volt supply to a 1.8 volt supply required for the core circuitry of die 120. The source of the 3.3 volt supply can be, for example, an external power supply.

The conventional packaging approach illustrated in FIG. 1 wherein voltage regulator 110 is on die 120 has several disadvantages. One disadvantage of such an on-die approach is the loss of die area. Voltage regulators are typically in the range of 300 microns by 400 microns and thus take up valuable die area that could be utilized more constructively.

Another disadvantage of the conventional packaging approach illustrated in FIG. 1 relates to manufacturing costs. As is known in the art, voltage regulators can be fabricated utilizing relatively inexpensive processes, for example a 0.25 micron CMOS process. However, when the voltage regulator is fabricated on-die, the processing of the voltage regulator is necessarily tied to the processing of the die itself. Thus, if the die is fabricated utilizing a relatively more expensive process, for example a silicon-germanium process, the production cost for the voltage regulator is raised concomitantly.

A further disadvantage of the conventional approach illustrated in FIG. 1 is the susceptibility of an on-die voltage regulator, such as voltage regulator 110 on die 120, to noise produced by the die. Noise from the die can impair the voltage regulator's ability to generate a stable and desired output voltage. More specifically, the reference voltage at the voltage regulator's reference terminal can fluctuate due to the noise. As a result, the accuracy of the reference is compromised and the voltage regulator's output voltage is destabilized. Manifestly, the voltage supplied to the die's core circuitry will be likewise unstable.

There is thus a need in the art for an approach for utilizing a voltage regulator which will free up valuable die area, which will be cost effective and which will shield the voltage regulator from noise produced by the die so as to result in superior voltage regulation.

SUMMARY OF THE INVENTION

The present invention is directed to voltage regulation for semiconductor dies and related structure. The invention presents an innovative packaging approach wherein a voltage regulator is placed off-die and directly on the packaging substrate.

According to one embodiment, a voltage regulator is placed directly on the packaging substrate. An output of the voltage regulator is a core voltage line that runs adjacent to a die attach area on the packaging substrate. An input of the voltage regulator is typically coupled to a power supply which, in one embodiment, is also an I/O voltage line that runs adjacent to the die attach area on the packaging substrate. In one embodiment, the core voltage line is shaped as a ring encircling the die attach area on the packaging substrate. In another embodiment, the I/O voltage line is also shaped as a ring encircling the die attach area on the packaging substrate.

The I/O voltage line, or the I/O voltage ring as the case may be, provides the voltage regulator with an external power supply from which the voltage regulator produces a steady output voltage on the core voltage line, or the core voltage ring. Further, a semiconductor die having at least one I/O Vdd bond pad and at least one core Vdd bond pad can be mounted in the die attach area. The I/O Vdd bond pad of the semiconductor die can be connected to the I/O voltage ring in a manner known in the art, such as by use of bond wires. Similarly, the core Vdd bond pad of the semiconductor die can be connected to the core voltage ring also in a manner known in the art, such as by use of bond wires.

By placing the voltage regulator off-die, the invention results in superior voltage regulation, since the off-die voltage regulator is not exposed to the noise produced by the digital circuitry of the semiconductor die containing the core. Moreover, the invention results in the freeing up of valuable semiconductor die space for uses related to the core functions. Further, because the voltage regulator is placed off-die, the voltage regulator can be fabricated utilizing a relatively inexpensive process to further reduce production costs.

DETAILED DESCRIPTION OF THE INVENTION

The present invention is directed to voltage regulation for semiconductor dies and related structure. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely example embodiments of the invention. To maintain brevity, other embodiments of the invention utilizing the principles of the present invention are not specifically described in the present application and are not specifically illustrated by the present drawings.

Figure 1:
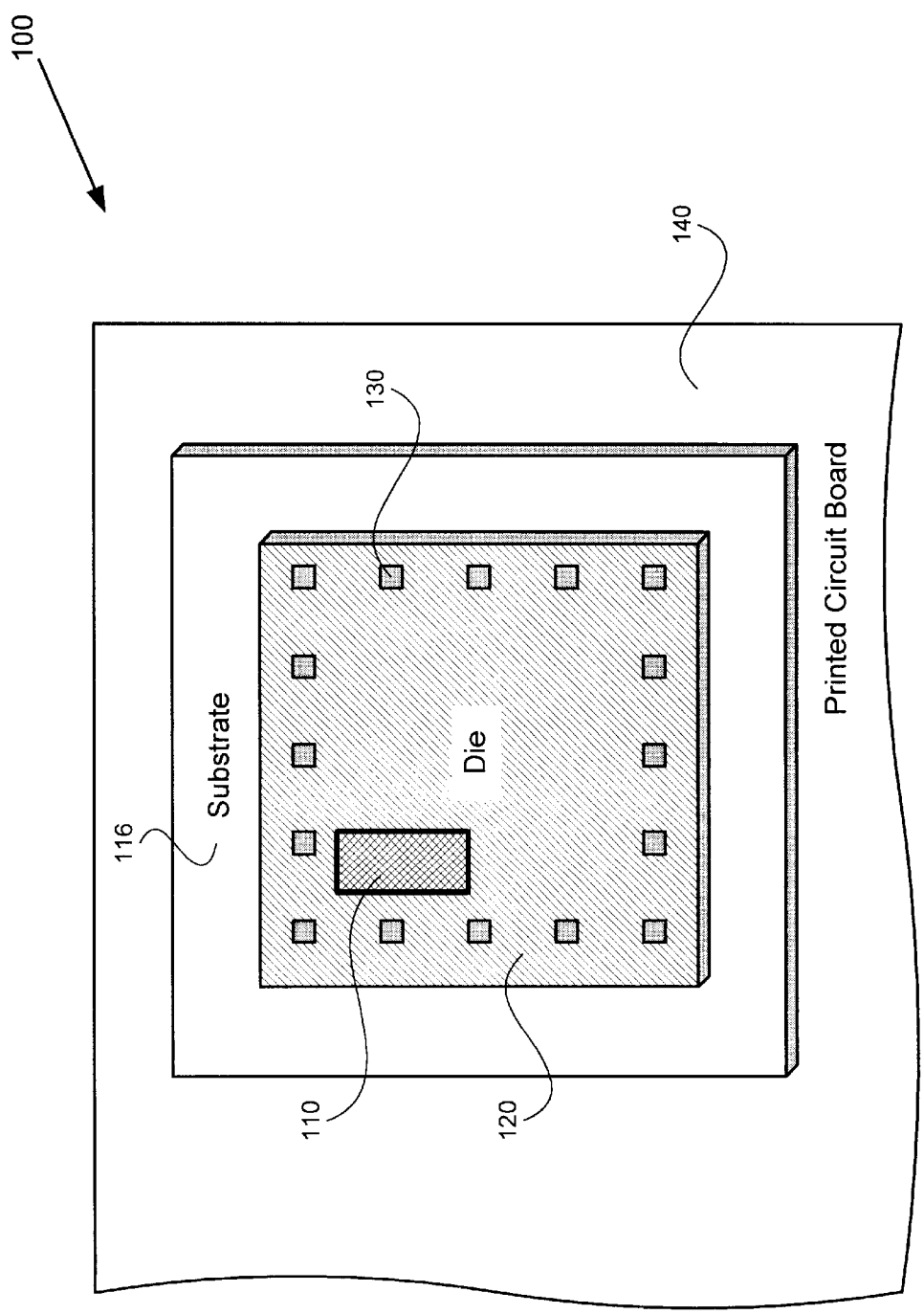
FIG. 1 illustrates a conventional approach wherein a voltage regulator is fabricated on-die.
Figure 2:
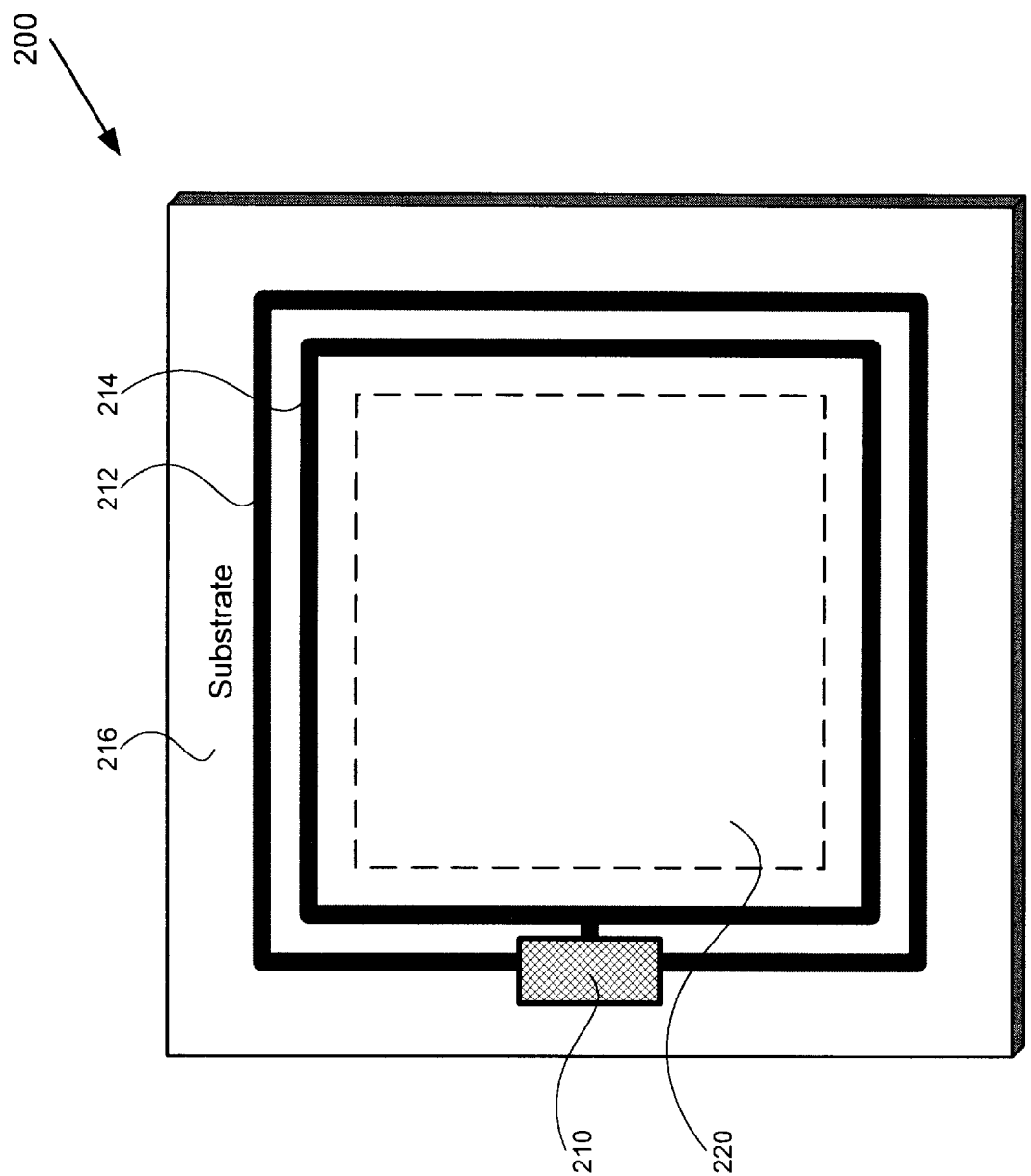
FIG. 2 illustrates an exemplary approach according to an embodiment of the present invention wherein a voltage regulator is fabricated on a packaging substrate.

Illustrated in FIG. 2 is exemplary structure 200, which is used to describe one embodiment of the present invention. Certain details and features have been left out of FIG. 2 which are apparent to a person of ordinary skill in the art. As shown in FIG. 2, the innovative packaging approach illustrated by exemplary structure 200 comprises packaging substrate 216 on which is fabricated voltage regulator 210. Voltage regulator 210 is electrically connected to input voltage ring 212 and output voltage ring 214, where input voltage ring 212 and output voltage ring 214 encircle die attach area 220 as shown in structure 200.

In the present example, packaging substrate 216 is a ceramic ball grid array ("BGA") package. Thus, a series of solder balls (not shown) on the bottom side of packaging substrate 216 can be used to connect the package to a printed circuit board. It is appreciated, however, that many other types of die packages known in the art may be utilized to implement the present invention as disclosed and claimed herein.

In exemplary structure 200, voltage regulator 210 is directly on packaging substrate 216 and can be fabricated utilizing, for example, a 0.25 micron CMOS process. In the present embodiment, voltage regulator 210 can be, for example, either a "linear" or "switch" regulator designed to convert a 3.3 input voltage to a steady 1.8 output voltage. The fabrication and operation of voltage regulators, such as voltage regulator 210, are well known in the art.

Continuing with FIG. 2, voltage regulator 210 is connected to input voltage ring 212 and output voltage ring 214. Input voltage ring 212 provides voltage regulator 210 with an external power supply, which in the present embodiment is a 3.3 volt input power supply. Voltage regulator 210 takes the 3.3 input voltage supplied by input voltage ring 212 and generates a steady 1.8 output voltage. This output voltage is then carried by output voltage ring 214. Input and output voltage rings 212 and 214, respectively, can be routed directly onto packaging substrate 216 in a manner known in the art and can comprise any suitable metal. For example, input and output voltage rings 212 and 214, respectively, can comprise copper or aluminum. As shown, input voltage ring 212 and output voltage ring 214 "encircle" die attach area 220, forming concentric squares around die attach area 220.

Thus, structure 200 depicted in FIG. 2 illustrates an innovative packaging approach wherein the voltage regulator is placed off-die and directly on the packaging substrate. As shown, the voltage regulator is electrically connected to an input voltage ring which supplies the voltage regulator with an input power supply, and the voltage regulator generates a steady output voltage to an output voltage ring. Also, the input and output voltage rings connected to the voltage regulator encircle a die attach area wherein a semiconductor die can be mounted and attached to the packaging substrate.

Figure 3:
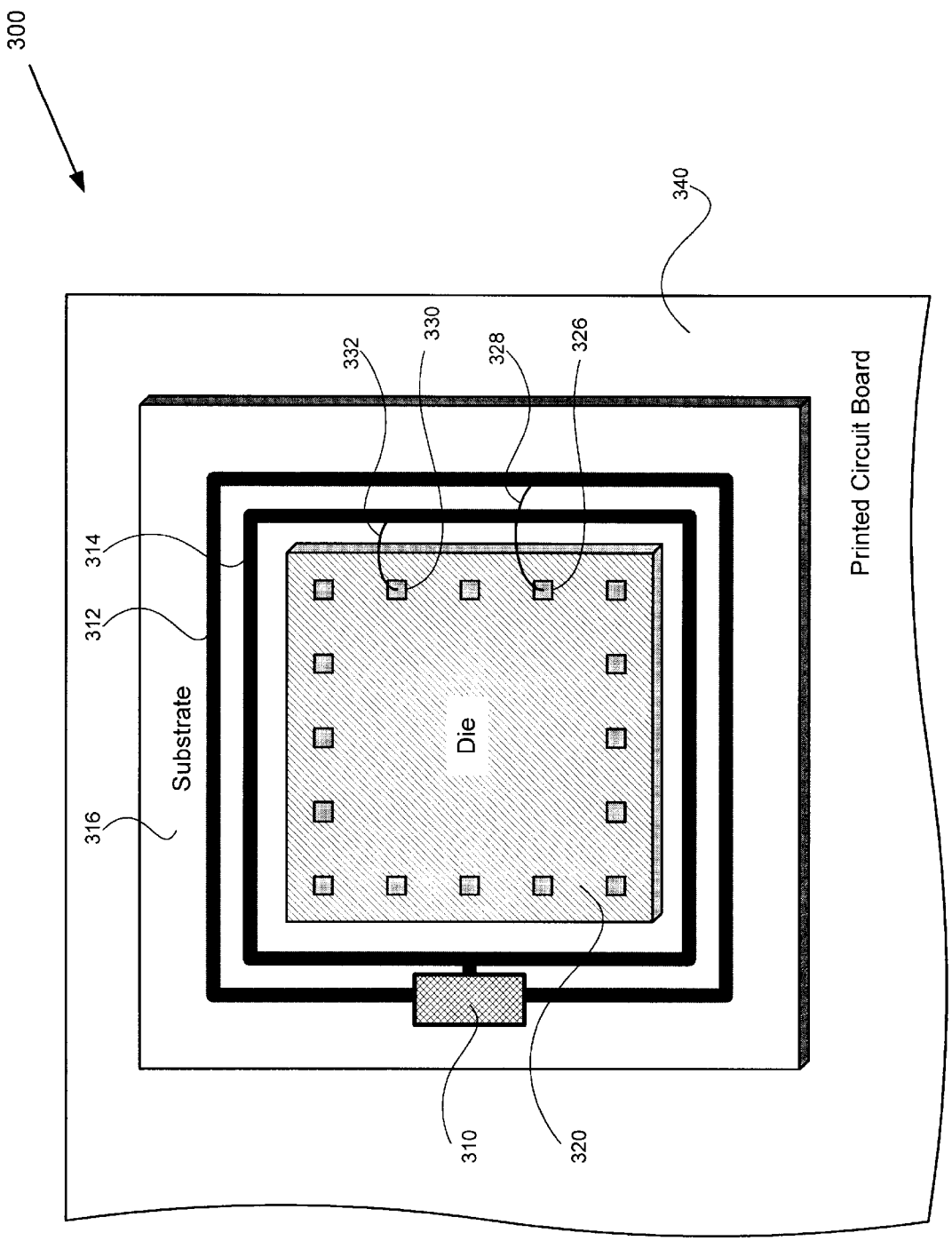
FIG. 3 illustrates an exemplary approach according to an embodiment of the present invention wherein a voltage regulator is fabricated on a packaging substrate.

Reference is now made to FIG. 3 which shows exemplary structure 300. Exemplary structure 300 illustrates a packaging approach in accordance with one embodiment of the invention. Exemplary structure 300 comprises packaging substrate 316 mounted onto printed circuit board ("PCB") 340. Packaging substrate 316 can be connected to PCB 340 in a manner known in the art, for example through solder balls of a ball grid array (not shown).

Continuing with FIG. 3, in the present embodiment, packaging substrate 316 is similar to packaging substrate 216 in FIG. 2. As seen in FIG. 3, packaging substrate 316 has a voltage regulator, i.e. voltage regulator 310, attached directly on packaging substrate 316. Voltage regulator 310 is connected to input voltage ring 312 which supplies voltage regulator 310 with a 3.3 input voltage. Voltage regulator 310 is also connected to output voltage ring 314. In the present embodiment, voltage regulator 310 takes the 3.3 input voltage from input voltage ring 312 and produces a 1.8 output voltage that is then carried by output voltage ring 314. Input voltage ring 312 and output voltage ring 314 are thus equivalent to input voltage ring 212 and output voltage ring 214, respectively, illustrated in FIG. 2. The dimensions of input voltage ring 312 and output voltage ring 314 should be suitable for the current they are intended to carry and also be sufficient to support subsequent bonding wires. As an example, the width of the voltage rings can be approximately 50 microns wide.

Continuing with FIG. 3, semiconductor die 320 is mounted and attached to packaging substrate 316 and is "encircled" by input voltage ring 312 and output voltage ring 314. Semiconductor die 320 can be attached to packaging substrate 316 in a manner known in the art, such as by utilization of an epoxy. Semiconductor die 320 comprises bond pads, such as bond pads 326 and 330. The bond pads of semiconductor die 320 generally serve as means by which semiconductor die 320 can receive Vdd and ground and also as means by which semiconductor die 320 can be electrically connected to other devices on PCB 340 by way of, for example, bond wires and/or leads in a manner known in the art. The bond pads providing means for electrical connection to other devices are also referred to as "signal bond pads" in the present application.

As shown, bond pad 326 is connected to input voltage ring 312 by bond wire 328, and bond pad 330 is connected to output voltage ring 314 by bond wire 332. Thus, in the embodiment illustrated in FIG. 3, bond pad 326 is connected to the 3.3 volt external power supply that is also supplying power to voltage regulator 310. At the same time, the 1.8 volts outputted from voltage regulator 310 provides power to bond pad 330, also called the "core Vdd bond pad" in the present application. Core Vdd bond pad 330 can in turn supply the core circuitry of semiconductor die 320 with a steady 1.8 volts.

As can be seen, by placing voltage regulator 310 directly on packaging substrate 316 and having the regulator's output voltage line, i.e. output voltage ring 314, encircle semiconductor die 320, power to the core circuitry of semiconductor die 320 can be easily provided by utilization of bond wires and bond pads, such as bond wire 332 and core Vdd bond pad 330. Through core Vdd bond pad 330 the appropriate Vdd level, for example 1.8 volts, can be provided to the core circuitry of semiconductor die 320.

Bond pad 326, also called "I/O Vdd bond pad" in the present application, provides the desired Vdd level to the respective input/output ("I/O") circuitry associated with each signal bond pad in semiconductor die 320. As can be seen, power to the I/O circuitry associated with each signal bond pad of semiconductor die 320 can be easily provided by utilization of bond wires and bond pads, such as bond wire 328 and I/O Vdd bond pad 326. Through I/O Vdd bond pad 326 the appropriate Vdd level, for example 3.3 volts, can be provided to the I/O circuitry associated with each signal bond pad of semiconductor die 320. In the present application, input voltage ring 312 is also referred to as "I/O voltage ring" 312 while output voltage ring 314 is also referred to as "core voltage ring" 314. It is manifest to one of ordinary skill in the art that I/O voltage ring 312 and core voltage ring 314 can in general be of any configuration or geometry and are not limited to a "ring" configuration. In fact, a common configuration for either ring 312 or ring 314 is a straight distribution line. As such, I/O voltage ring 312 is generally referred to as an "I/O voltage line" while core voltage ring 314 is generally referred to as a "core voltage line" in the present application.

Thus, exemplary structure 300 shown in FIG. 3 illustrates an innovative packaging approach wherein the voltage regulator is placed off-die and directly on the packaging substrate. The voltage regulator supplies the core circuitry of the semiconductor die with a stable and desired voltage through bond wires connecting bond pads on the semiconductor die to the voltage regulator's output voltage ring. At the same time, the I/O circuitry of the semiconductor die are supplied with the voltage regulator's input voltage by way of bond wires to an input voltage ring which is also connected to the voltage regulator and provides the voltage regulator with an input power supply.

In one embodiment of the invention, which is not illustrated in any of the Figures, two or more off-die voltage regulators are connected in series to provide the core circuitry of the semiconductor die with greater current as may be needed. An input voltage line can be connected to the voltage regulators, which can generate a steady output voltage to an output voltage ring encircling the semiconductor die. In a similar fashion as described in FIG. 3, the output voltage from the off-die voltage regulators being carried by the output voltage ring can be tapped into by the semiconductor die through bond wires and bond pads.

It is appreciated by the above detailed description that the present invention provides voltage regulation for semiconductor dies and related structure. In one embodiment, the placement of the voltage regulator off-die results in superior voltage regulation, since the off-die voltage regulator is not exposed to the noise produced by the digital circuitry of the semiconductor die containing the core. Another advantage of the present invention over the conventional on-die voltage regulators is the freeing up of valuable semiconductor die space for uses related to the core functions. Moreover, because the voltage regulator in the present invention is placed off-die, the voltage regulator can be fabricated utilizing a relatively inexpensive process, such as a 0.25 micron CMOS process, to further reduce production costs, while the semiconductor die carrying the core circuitry can be fabricated by a more advanced process.

From the above description of the invention it is manifest that various techniques can be used for implementing the concepts of the present invention without departing from its scope. Moreover, while the invention has been described with specific reference to certain embodiments, a person of ordinary skills in the art would appreciate that changes can be made in form and detail without departing from the spirit and the scope of the invention. For example, as stated above, although only one voltage regulator is illustrated in the Figures of the present application, the present invention permits the assembly of a plurality of voltage regulators to provide the semiconductor die with greater current. As another example, instead of a 3.3 volt to a 1.8 volt voltage regulator, the present invention is readily applicable to many different types of voltage regulators.

The described embodiments are to be considered in all respects as illustrative and not restrictive. It should also be understood that the invention is not limited to the particular embodiments described herein but is capable of many rearrangements, modifications, and substitutions without departing from the scope of the invention.

Thus, voltage regulation for semiconductor dies and related structure have been described.

What is claimed is:

1. A structure comprising:
   a voltage regulator on a packaging substrate;
   an input voltage line connected to said voltage regulator, said input voltage line being adjacent to a die attach area on said packaging substrate, said input voltage line being suitable for connection to a power supple;
   an output voltage line connected to said voltage regulator, said output voltage line being adjacent to said die attach area on said packaging substrate.

2. The structure of claim 1 wherein said output voltage line is an output voltage ring encircling said die attach area.

3. The structure of claim 1 wherein said input voltage line supplies a first voltage and said output voltage line supplies a second voltage, said second voltage being generated by said voltage regulator from said first voltage.

4. The structure of claim 3 wherein said input voltage line is an input voltage ring encircling said die attach area.

5. The structure of claim 1 wherein said output voltage line comprises a metal selected from the group consisting of copper and aluminum.

6. The structure of claim 3 wherein said input voltage line comprises a metal selected from the group consisting of copper and aluminum.

7. The structure of claim 3 further comprising a semiconductor die attached to said packaging substrate in said die attach area.

8. The structure of claim 7 wherein said semiconductor die comprises at least one I/O Vdd bond pad and at least one core Vdd bond pad.

9. The structure of claim 8 further comprising at least one bond wire connecting said at least one I/O Vdd bond pad to said input voltage line.

10. The structure of claim 8 further comprising at least one bond wire connecting said at least one core Vdd bond pad to said output voltage line.

11. The structure of claim 9 further comprising at least one bond wire connecting said at least one core Vdd bond pad to said output voltage line.

12. The structure of claim 1 wherein said packaging substrate is mounted on a printed circuit board.

13. The structure of claim 1 comprising a plurality of voltage regulators on said packaging substrate, said plurality of voltage regulators being suitable for connection to said power supply.

14. A structure comprising:
    a packaging substrate housing at least one off-die voltage regulator and at least one semiconductor die;
    an input voltage line connected to said at least one off-die voltage regulator, said input voltage line being adjacent to said at least one semiconductor die, said input voltage line being suitable for connection to a power supply;

an output voltage line connected to said at least one off-die voltage regulator, said output voltage line being adjacent to said at least one semiconductor die;

said at least one off-die voltage regulator receiving a first voltage from said input voltage line and providing a second voltage to said output voltage line for use by said semiconductor die;

said semiconductor die having at least one core Vdd bond pad coupled to said output voltage line.

15. The structure of claim 14 wherein said output voltage line is an output voltage ring encircling said semiconductor die.

16. The structure of claim 14 wherein said input voltage line is an input voltage ring encircling said semiconductor die.

17. The structure of claim 14 wherein said output voltage line comprises a metal selected from the group consisting of copper and aluminum.

18. The structure of claim 14 wherein said input voltage line comprises a metal selected from the group consisting of copper and aluminum.

19. The structure of claim 14 wherein said semiconductor die further comprises at least one I/O Vdd bond pad.

20. The structure of claim 19 further comprising at least one bond wire connecting said at least one I/O Vdd bond pad to said input voltage line.

21. The structure of claim 19 further comprising at least one bond wire connecting said at least one core Vdd bond pad to said output voltage line.

22. The structure of claim 20 further comprising at least one bond wire connecting said at least one core Vdd bond pad to said output voltage line.

23. The structure of claim 14 wherein said packaging substrate is mounted on a printed circuit board.

* * * * *